US010910242B2

(12) United States Patent
Lim et al.

(10) Patent No.: US 10,910,242 B2
(45) Date of Patent: Feb. 2, 2021

(54) TEMPERATURE CONTROLLER FOR MANUFACTURING SEMICONDUCTOR

(71) Applicant: Techest, Co., Ltd., Anseong-si (KR)

(72) Inventors: Yong Kyun Lim, Suwon-si (KR); Cheol Won Jang, Hwaseong-si (KR); Min Jin Han, Hwaseong-si (KR); Jae Geon Kim, Osan-si (KR)

( * ) Notice: Subject to any disclaimer, the term of this patent is extended or adjusted under 35 U.S.C. 154(b) by 245 days.

(21) Appl. No.: 16/265,625

(22) Filed: Feb. 1, 2019

(65) Prior Publication Data
US 2019/0244840 A1    Aug. 8, 2019

(51) Int. Cl.
| | |
|---|---|
| *H01L 21/67* | (2006.01) |
| *C23C 16/46* | (2006.01) |
| *H01J 37/32* | (2006.01) |
| *G05B 11/42* | (2006.01) |
| *G05D 23/19* | (2006.01) |
| *G05D 7/06* | (2006.01) |

(52) U.S. Cl.
CPC ...... *H01L 21/67248* (2013.01); *C23C 16/463* (2013.01); *G05B 11/42* (2013.01); *G05D 7/0635* (2013.01); *G05D 23/1905* (2013.01); *H01J 37/32522* (2013.01); *H01L 21/67017* (2013.01); *H01L 21/67098* (2013.01); *H01L 21/67109* (2013.01); *H01L 21/67276* (2013.01); *H01J 37/32724* (2013.01)

(58) Field of Classification Search
CPC ......... H01L 21/67248; H01L 21/67109; H01L 21/67017; H01L 21/67098; H01L 21/67276; G05B 11/42; G05D 7/0635; G05D 23/1902; C23C 16/463; H01J 37/32522; H01J 37/32724
See application file for complete search history.

(56) References Cited

U.S. PATENT DOCUMENTS

| | | | | |
|---|---|---|---|---|
| 4,966,145 | A * | 10/1990 | Kikumoto | A47C 7/74 165/46 |
| 2009/0223932 | A1* | 9/2009 | Hida | H01J 37/32091 216/67 |
| 2010/0101771 | A1* | 4/2010 | Roy | H01L 21/67109 165/247 |
| 2010/0236772 | A1* | 9/2010 | Novotny | H05K 7/20836 165/287 |
| 2011/0308560 | A1* | 12/2011 | Arbuckle | H01L 35/30 136/205 |
| 2016/0186988 | A1* | 6/2016 | Shimada | F22B 37/20 137/798 |

(Continued)

*Primary Examiner* — Jeffrie R Lund
(74) *Attorney, Agent, or Firm* — Antonio Ha & U.S. Patent, LLC

(57) ABSTRACT

A temperature controller for semiconductor fabrication comprises a lower chiller connected with a lower chamber of a processing chamber and configured to adjust a temperature of the lower chamber, an electrostatic chuck disposed in the lower chamber and an upper chiller connected with an upper chamber of the processing chamber and configured to adjust a temperature of the upper chamber, a heater disposed in the upper chamber. In the temperature controller for semiconductor fabrication, the three-way valve may be installed on the cooling fluid supplying pipe, and the bypass pipe may be installed between the three-way valve and the cooling fluid collecting pipe to reduce the degree of bypass opening of the three-way valve.

9 Claims, 5 Drawing Sheets

(56) References Cited

U.S. PATENT DOCUMENTS

| | | | | |
|---|---|---|---|---|
| 2016/0293461 A1* | 10/2016 | Roberts, Jr. | ............ | G06Q 50/04 |
| 2019/0214279 A1* | 7/2019 | Marcacci | ................ | F28F 27/02 |
| 2019/0244840 A1* | 8/2019 | Lim | ................ | H01L 21/67248 |
| 2020/0064031 A1* | 2/2020 | Yamano | ................ | F25B 41/003 |
| 2020/0124299 A1* | 4/2020 | Sugitani | ................ | F24F 3/147 |
| 2020/0309383 A1* | 10/2020 | Miyazaki | ................ | F24D 3/08 |

\* cited by examiner

TEMPERATURE CONTROLLER FOR MANUFACTURING SEMICONDUCTOR

CROSS-REFERENCE TO RELATED APPLICATIONS

This patent application claims priority under 35 U.S.C. § 119 to Korean Patent Application No. 10-2018-0015376, filed on Feb. 8, 2018, in the Korean Intellectual Property Office, the disclosure of which is incorporated by reference herein in its entirety.

TECHNICAL FIELD

Embodiments of the disclosure relate to temperature controllers for manufacturing semiconductors.

DESCRIPTION OF RELATED ART

Semiconductor fabrication may be carried out in various processes, e.g., a preparation process of producing a wafer and designing circuitry, a pre-process of forming electronic circuitry (processing the wafer) by forming various kinds of films on the surface of the wafer and repeatedly cutting particular portions using prepared masks, and a post-process of assembly and test.

Among such a series of processes for semiconductor fabrication, some are performed in the processing chamber in main equipment with necessary tools. For example, etching, deposition, and ion implantation may be carried out in the processing chamber.

For such processes, it may be critical to maintain the processing temperature and, to that end, a temperature controller (e.g., a chiller) may be used. To control the temperature in the processing chamber for chemical vapor deposition (CVD), atomic layer deposition (ALD), or other processes performed at high temperature, the temperature controller may supply a cooling fluid properly cooled or heated to the inside of the processing chamber.

SUMMARY

According to an embodiment, a temperature controller for semiconductor fabrication comprises a lower chiller connected with a lower chamber of a processing chamber and configured to adjust a temperature of the lower chamber and an upper chiller connected with an upper chamber of the processing chamber and configured to adjust a temperature of the upper chamber. An electrostatic chuck may be disposed in the lower chamber. A heater may be disposed in the upper chamber. The upper chiller may include a storage tank configured to store a cooling fluid, a pump connected with the storage tank and configured to pump the cooling fluid, a heat exchanger connected with the pump and configured to exchange heat from the cooling fluid, a three-way valve connected with the heat exchanger and configured to supply a portion of the cooling fluid to the upper chamber through a supplying pipe and bypass another portion of the cooling fluid to the storage tank through a bypass pipe, an upper chamber temperature sensor configured to sense the temperature of the upper chamber, a first proportional integral derivative (PID) controller configured to determine an amount of heat exchanged in the heat exchanger based on the temperature sensed by the upper chamber temperature sensor, and a second PID controller configured to determine a degree of bypass opening of the three-way valve based on the temperature sensed by the upper chamber temperature sensor.

The temperature controller may further comprise a controller configured to control the first PID controller and the second PID controller, a supplying pipe temperature sensor and a supplying pipe flow sensor connected with the supplying pipe, and a collecting pipe temperature sensor connected with a collecting pipe connecting the storage tank and the upper chamber. The controller may be configured to control the first PID controller and the second PID controller based on a temperature of supply, a temperature of collection, and a flow rate of supply of the cooling fluid from the supplying pipe temperature sensor, the collecting pipe temperature sensor, and the supplying pipe flow sensor.

The first PID controller may be configured to control the amount of heat exchanged in the heat exchanger based on a temperature sensed by the supplying pipe temperature sensor, a temperature sensed by the collecting pipe temperature sensor, and the temperature sensed by the upper chamber temperature sensor and obtained from the controller.

The first PID controller may be configured to, when the temperature sensed by the upper chamber temperature sensor is higher than a preset reference value, increase the amount of heat exchanged in the heat exchanger to reduce the temperature of the cooling fluid supplied through the supplying pipe.

The first PID controller may be configured to, when the temperature sensed by the upper chamber temperature sensor is lower than a preset reference value, decrease the amount of heat exchanged in the heat exchanger to increase the temperature of the cooling fluid supplied through the supplying pipe.

The second PID controller may be configured to control the degree of bypass opening of the three-way valve based on the temperature sensed by the upper chamber temperature sensor and the flow rate sensed by the supplying pipe flow sensor and obtained from the controller.

The second PID controller may be configured to, when the temperature sensed by the upper chamber temperature sensor is higher than the preset reference value, decrease the degree of bypass opening of the three-way valve to increase the flow rate of the cooling fluid supplied through the supplying pipe.

The second PID controller may be configured to, when the temperature sensed by the upper chamber temperature sensor is lower than the preset reference value, increase the degree of bypass opening of the three-way valve to decrease the flow rate of the cooling fluid supplied through the supplying pipe.

An automated pressure adjusting valve may be installed on the bypass pipe and is configured to automatically adjust a pressure in the bypass pipe according to a variation in the degree of opening of the three-way valve.

BRIEF DESCRIPTION OF THE DRAWINGS

A more complete appreciation of the disclosure and many of the attendant aspects thereof will be readily obtained as the same becomes better understood by reference to the following detailed description when considered in connection with the accompanying drawings, wherein.

DETAILED DESCRIPTION OF EXEMPLARY EMBODIMENTS

Figure 1:
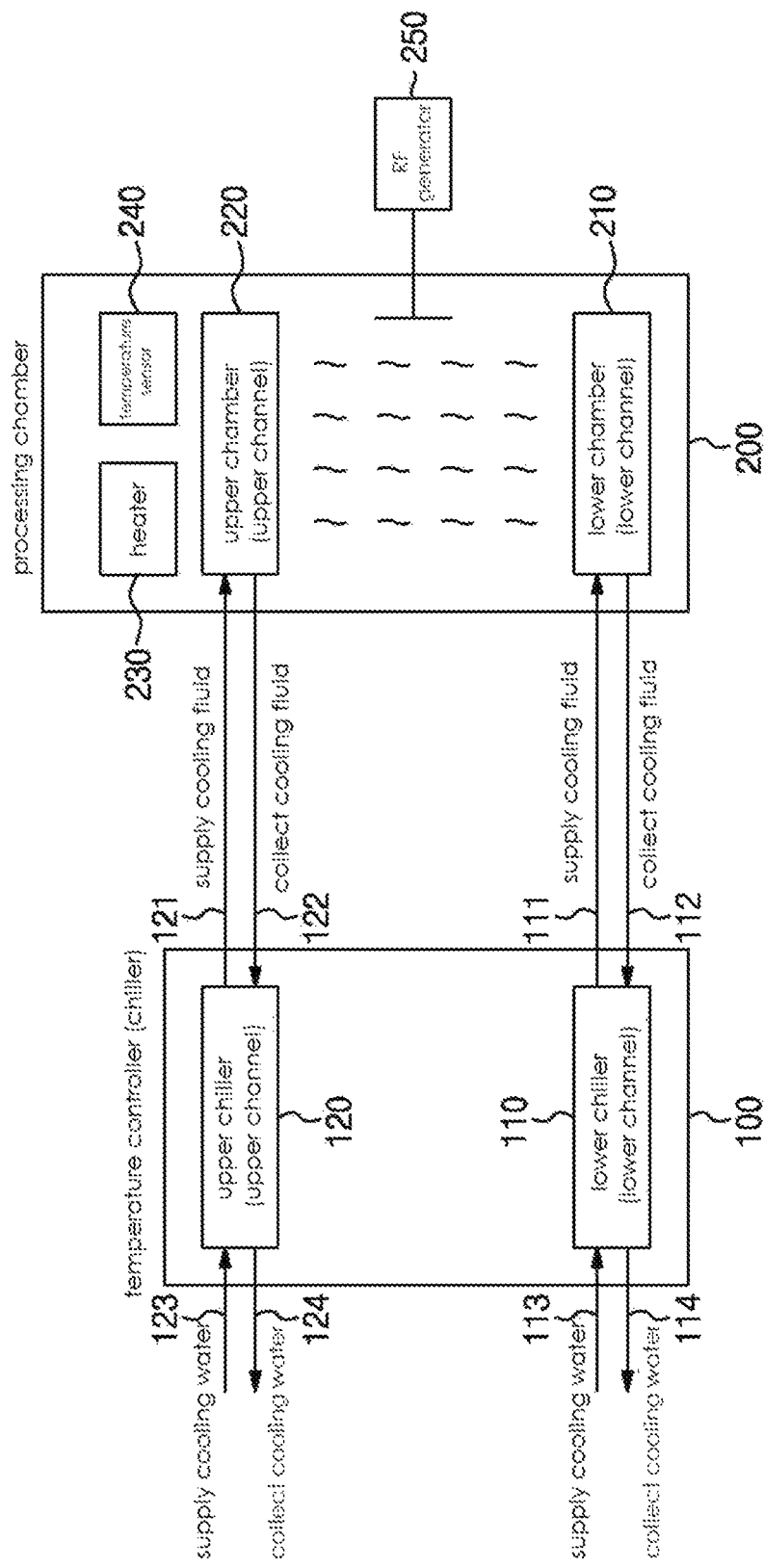
FIG. 1 is a block diagram illustrating an example configuration of a temperature controller connected with a processing chamber for semiconductor fabrication according to an embodiment.

Hereinafter, embodiments of the disclosure are described in detail with reference to the accompanying drawings. Like reference denotations may be used to refer to the same or substantially the same elements throughout the specification and the drawings.

Embodiments of the disclosure are provided to thoroughly explain the disclosure to those skilled in the art, and various modifications may be made thereto, and the scope of the disclosure is not limited thereto. Embodiments of the disclosure are provided to fully and thoroughly convey the spirit of the disclosure to those skilled in the art.

As used herein, the thickness and size of each layer may be exaggerated for ease or clarity of description. The same reference denotations may be used to refer to the same or substantially the same elements throughout the specification and the drawings. As used herein, the term "A and/or B" encompasses any, or one or more combinations, of A and B. It will be understood that when an element or layer is referred to as being "on," "connected to," "coupled to," "adjacent to" another element or layer, it can be directly on, connected, coupled, or adjacent to the other element or layer, or intervening elements or layers may be present.

The terms as used herein are provided merely to describe some embodiments thereof, but not intended as limiting the disclosure. As used herein, the singular forms "a," "an," and "the" are intended to include the plural forms as well, unless the context clearly indicates otherwise. As used herein, the term "comprise," "include," and/or "comprising" or "including" does not exclude the presence or addition of one or more other components, steps, operations, and/or elements than the component, step, operation, and/or element already mentioned.

As used herein, the terms "first" and "second" may be used to describe various members, parts, regions, areas, layers, and/or portions, but the members, parts, regions, areas, layers, and/or portions are not limited thereby. These terms are used merely to distinguish one member, part, region, area, layer, or portion from another. Accordingly, the term "first member," "first part," "first region," "first area," "first layer," or "first portion" described herein may denote a "second member," "second part," "second region," "second area," "second layer," or "second portion" without departing from the teachings disclosed herein.

The terms "beneath," "below," "lower," "under," "above," "upper," "on," or other terms to indicate a position or location may be used for a better understanding of the relation between an element or feature and another as shown in the drawings. However, embodiments of the disclosure are not limited thereby or thereto. For example, where a lower element or an element positioned under another element is overturned, then the element may be termed as an upper element or element positioned above the other element. Thus, the term "under" or "beneath" may encompass, in meaning, the term "above" or "over."

As described herein, the controller and/or other related devices or parts may be implemented in hardware, firmware, application specific integrated circuits (ASICs), software, or a combination thereof. For example, the controller and/or other related devices or parts or its or their components may be implemented in a single integrated circuit (IC) chip or individually in multiple IC chips. Further, various components of the controller may be implemented on a flexible printed circuit board, in a tape carrier package, on a printed circuit board, or on the same substrate as the controller. Further, various components of the controller may be processes, threads, operations, instructions, or commands executed on one or more processors in one or more computing devices, which may execute computer programming instructions or commands to perform various functions described herein and interwork with other components. The computer programming instructions or commands may be stored in a memory to be executable on a computing device using a standard memory device, e.g., a random access memory (RAM). The computer programming instructions or commands may be stored in, e.g., a compact-disc read only memory (CD-ROM), flash drive, or other non-transitory computer readable media. It will be appreciated by one of ordinary skill in the art that various functions of the computing device may be combined together or into a single computing device or particular functions of a computing device may be distributed to one or other computing devices without departing from the scope of the disclosure.

As an example, the controller of the disclosure may be operated on a typical commercial computer including a central processing unit, a hard disk drive (HDD) or solid state drive (SSD) or other high-volume storage, a volatile memory device, a keyboard, mouse, or other input devices, and a monitor, printer, or other output devices.

FIG. 1 is a block diagram illustrating an example configuration of a temperature controller 100 connected with a processing chamber 200 for semiconductor fabrication according to an embodiment.

Referring to FIG. 1, a processing chamber 200 for second communication may include a lower chamber 210, an upper chamber 220, a heater 230, a temperature sensor 240, and a radio frequency (RF) generator 250.

The lower chamber 210 and the upper chamber 220 may be coupled together to form a single space. Merely for ease of description, the single space may be defined as the two chambers. The term "lower chamber" may be interchangeably used with the term "lower channel," and the term "upper chamber" may be interchangeably used with the term "upper channel." As an example, without limitation, the lower chamber 210 may be an electrostatic chuck on which, e.g., a wafer or a display is mounted. The heater 230 may be operated to control the temperature of the upper chamber 220 separately or differently from the lower chamber 210. The temperature sensor 240 may be operated to quickly sense variations in the temperature of the upper chamber 220. The RF generator 250 may provide RF power to provide a plasma atmosphere to the processing chamber 200, e.g., the lower chamber 210 and the upper chamber 220. The operation of the RF generator 250, as well as the heater 230, may sharply vary (e.g., increase) the temperature of the upper chamber 220.

A temperature controller 100 may be defined as a chiller and may include a lower chiller 110 and an upper chiller 120.

The lower chiller 110 may be defined as a lower channel, and the upper chiller 120 may be defined as an upper channel. The lower chiller 110 may be connected to the lower chamber 210 through a cooling fluid supplying pipe 111 and a cooling fluid collecting pipe 112. The upper chiller 120 may be connected to the upper chamber 220 through a cooling fluid supplying pipe 121 and a cooling fluid collecting pipe 122. The lower chiller 110 may be connected with a process cooling water (PCW) supplying pipe 113 and a PCW collecting pipe collecting pipe 114 for heat exchange. The upper chiller 120 may be connected with a PCW supplying pipe 123 and a PCW collecting pipe collecting pipe 124 for heat exchange.

By the above configuration, the lower chiller 110 of the temperature controller 100 may accurately and quickly control the temperature of the lower chamber 210 in a range from about −10° C. to about 40° C., and the upper chiller 120 of the temperature controller 100 may accurately and quickly control the temperature of the upper chamber 220 in a range from about 30° C. to about 80° C. Thus, temperature control in one processing chamber 200 may precisely and rapidly be performed through the dual-channel structure and, thus, the power consumption in the chillers may be reduced.

Figure 2:
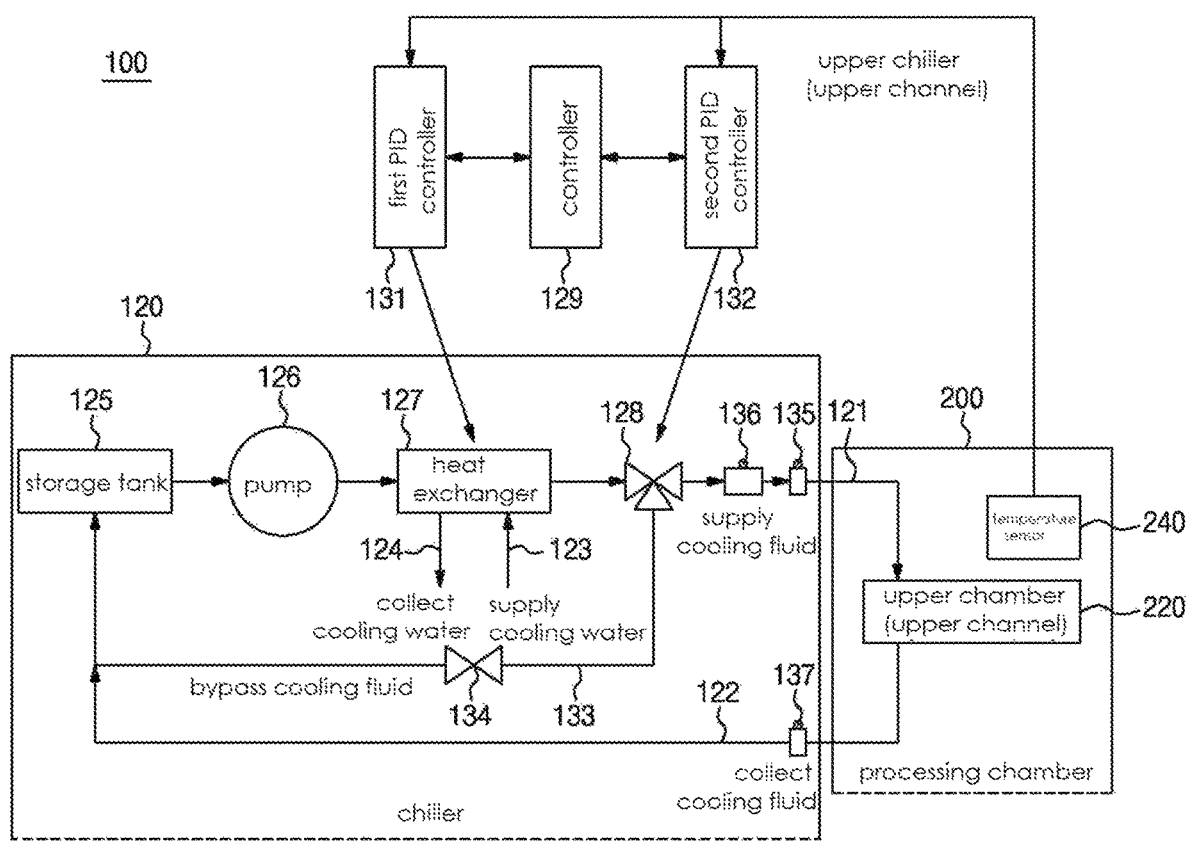
FIG. 2 is a block diagram illustrating an example configuration of a temperature controller connected with a processing chamber for semiconductor fabrication according to an embodiment.

FIG. 2 is a block diagram illustrating an example configuration of a temperature controller 100 connected with a processing chamber 200 for semiconductor fabrication according to an embodiment. The lower chiller 110 of the temperature controller 100 may be substantially the same in configuration and operation as the upper chiller 120. Thus, the description focuses primarily on the configuration and operation of the upper chiller 120 and may apply to the lower chiller 110.

Referring to FIG. 2, the upper chiller 120 of the temperature controller 100 may include a storage tank 125, a pump 126, a heat exchanger 127, a three-way valve 128, a controller 129, a first PID controller 131, and a second PID controller 132. PID stands for proportional integral derivative, e.g., meaning a kind of feedback control to allow the system to have a predetermined output value based on errors between control variables and a reference input and may be a combination of proportional control, proportional-integral control, and proportional-derivative control.

The storage tank 125 stores a cooling fluid, supplies the cooling fluid through the cooling fluid supplying pipe 121 to the upper chamber 220 and collects the cooling fluid from the upper chamber 220 through the cooling fluid collecting pipe 122, and collects the cooling fluid through a bypass pipe 133.

The pump 126 is connected to the storage tank 125 and pumps and delivers the cooling fluid to the heat exchanger 127.

The heat exchanger 127 is connected to the pump 126, exchanging the heat of the cooling fluid with cooling water (e.g., PCW). To that end, the PCW supplying pipe 123 and the PCW collecting pipe 124 may be connected to the heat exchanger 127. As another example, a thermoelectric element may be used as the heat exchanger 127. The heat exchanger 127 may be controlled directly by the first PID controller 131.

The three-way valve 128 may be connected to the heat exchanger 127 to supply a portion of the cooling fluid to the upper chamber 220 through the supplying pipe 121 and bypass another portion of the cooling fluid to the storage tank 125 through the bypass pipe 133. The three-way valve 128 may be controlled directly by the second PID controller 132.

The first PID controller 131 and the second PID controller 132 may receive temperature data from the temperature sensor 240 installed in the upper chamber 220. The first PID controller 131 and the second PID controller 132 may be controlled by the controller 129.

A supplying pipe temperature sensor 135 and a supplying pipe flow sensor 136 may be installed on the supplying pipe 121 between the three-way valve 128 and the upper chamber 220 to measure and transmit the temperature data and flow rate data to the controller 129. A collecting pipe temperature sensor 137 may be installed on the collecting pipe 122 between the storage tank 125 and the upper chamber 220 to measure and transmit the temperature data to the controller 129.

An automated pressure adjusting valve 134 may be installed on the bypass pipe 133 to automatically adjust the pressure of the bypass pipe 133 according to variations in the degree of opening of the three-way valve 128.

The first PID controller 131 may determine and control the amount of heat exchanged in the heat exchanger 127 based on the temperature measured or sensed by the temperature sensor 240 in the upper chamber 220. For example, the first PID controller 131 may determine and control the amount of heat exchanged in the heat exchanger 127 based on the temperature measured or sensed by the supplying pipe temperature sensor 135, the temperature measured or sensed by the collecting pipe temperature sensor 137, and the temperature measured or sensed by the upper chamber temperature sensor 240 which are obtained from the controller 129.

As an example, where the temperature measured or sensed by the upper chamber temperature sensor 240 is higher than a preset reference value, the first PID controller 131 may increase the amount of heat exchanged in the heat exchanger 127 to reduce the temperature of the cooling fluid supplied through the supplying pipe 121. In contrast, where the temperature measured or sensed by the upper chamber temperature sensor 240 is lower than the preset reference value, the first PID controller 131 may reduce the amount of heat exchanged in the heat exchanger 127 to increase the temperature of the cooling fluid supplied through the supplying pipe 121.

The second PID controller 132 may determine and control the degree of bypass opening of the three-way valve 128 based on the temperature measured or sensed by the upper chamber temperature sensor 240. For example, the second PID controller 132 may determine and control the degree of bypass opening of the three-way valve 128 based on the temperature measured or sensed by the upper chamber temperature sensor 240 and the flow rate measured or sensed by the supplying pipe flow sensor 136 which are obtained from the controller 129.

As an example, where the temperature measured or sensed by the upper chamber temperature sensor 240 is higher than a preset reference value, the second PID controller 132 may reduce the degree of bypass opening of the three-way valve 128 to increase the flow rate of the cooling fluid supplied through the supplying pipe 121. In contrast, where the temperature measured or sensed by the upper chamber temperature sensor 240 is lower than the preset reference value, the second PID controller 132 may increase the degree of bypass opening of the three-way valve 128 to reduce the flow rate of the cooling fluid supplied through the supplying pipe 121.

Where the temperature in the processing chamber 200 is about to drastically vary, the three-way valve 128 may immediately be operated by the PID controllers 131 and 132 to alter the flow rate of the cooling fluid supplied to the processing chamber 200, thereby preventing damage to the inside of the processing chamber 200 due to thermal impacts.

Figure 3:
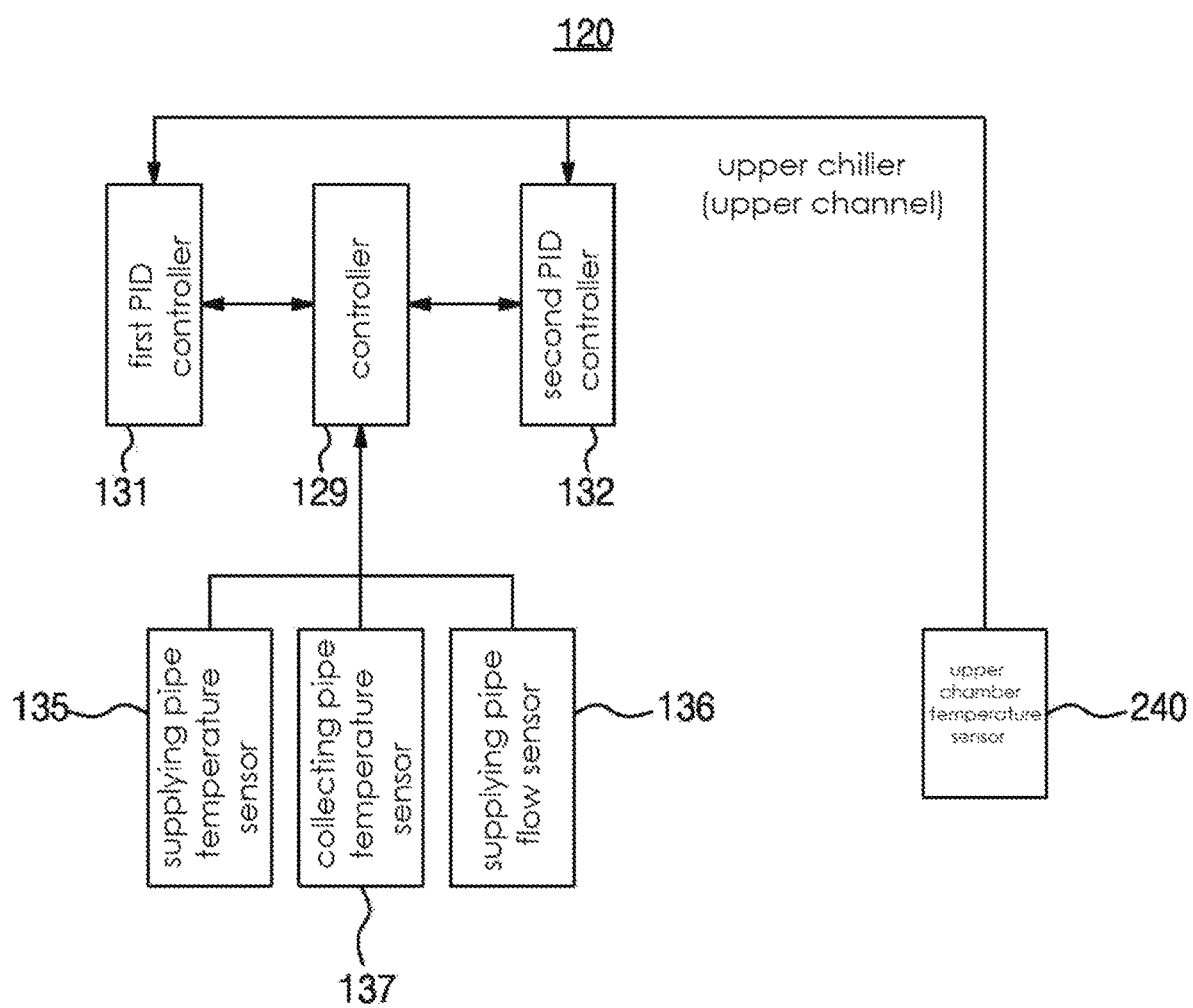
FIG. 3 is a block diagram illustrating a configuration of part of a temperature controller for semiconductor fabrication according to an embodiment.

FIG. 3 is a block diagram illustrating a configuration of part of a temperature controller 100 for semiconductor fabrication according to an embodiment.

Referring to FIGS. 2 and 3, sensing data obtained by the fluid temperature sensor 135 connected with the supplying pipe 121 of the upper chiller 120, the fluid temperature sensor 137 connected with the collecting pipe 122 of the upper chiller 120, and the flow sensor 136 connected with the supplying pipe 121 of the upper chiller 120 may directly be transmitted to the controller 129. Sensing data obtained by the temperature sensor 240 installed in the upper chamber 220 may directly be transmitted to the first PID controller 131 and the second PID controller 132.

Thus, the controller 129 transmits data regarding the temperature of the cooling fluid in the supplying pipe 121, the temperature of the cooling fluid in the collecting pipe 122, and/or the flow rate of the cooling fluid in the supplying pipe 121 to the first PID controller 131 and/or the second PID controller 132, and the first PID controller 131 and/or the second PID controller 132 controls and/or controls the degree of bypass opening of the three-way valve 128 and/or the amount of heat exchanged in the heat exchanger 127 based on the data and temperature data of the upper chamber 220 and using three parameters of proportional gain, time of integral, and time of derivative.

Figure 4:
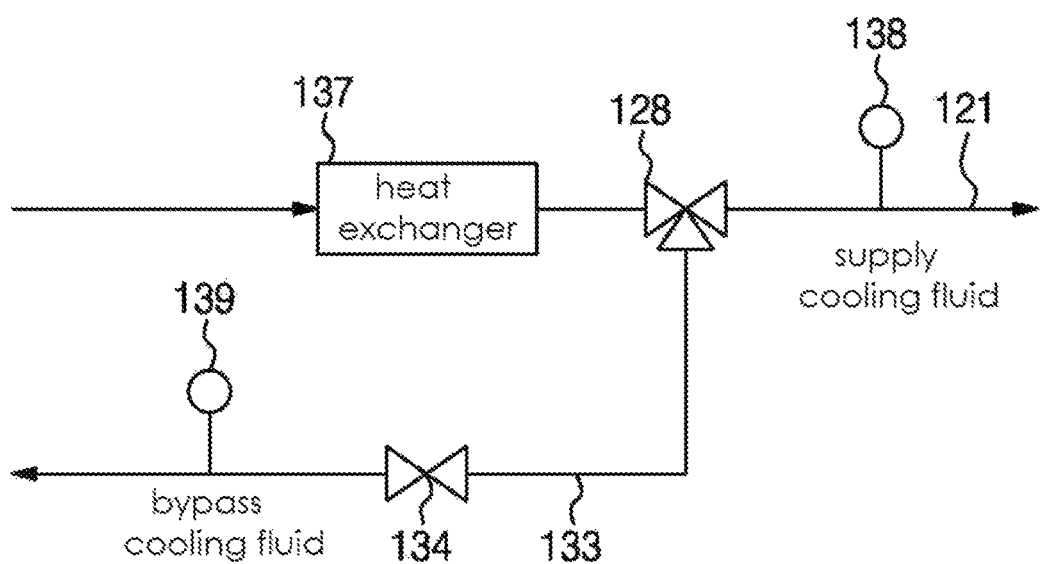
FIG. 4 is a block diagram illustrating a configuration of part of a temperature controller for semiconductor fabrication according to an embodiment.

FIG. 4 is a block diagram illustrating a configuration of part of a temperature controller 100 for semiconductor fabrication according to an embodiment.

Referring to FIG. 4, an automated pressure adjusting valve 134 may be installed on the cooling fluid bypass pipe 133 to automatically adjust the pressure of the bypass pipe 133 according to variations in the degree of opening of the three-way valve 128. A supplying pipe pressure sensor 138 may be installed on the cooling fluid supplying pipe 121, and a bypass pipe pressure sensor 139 may be installed on the bypass pipe 133, sensing and monitoring, in real-time, variations in the pressure of the cooling fluid supplying pipe 121 and the bypass pipe 133.

Thus, the adjustment of pressure in the bypass pipe 133 due to a difference in pressure between the time of bypass and time of supply of the cooling fluid may automatically be carried out by the automated pressure adjusting valve 134, thus preventing damage to the bypass pipe 133, the supplying pipe 121, and the collecting pipe 122.

Figure 5:
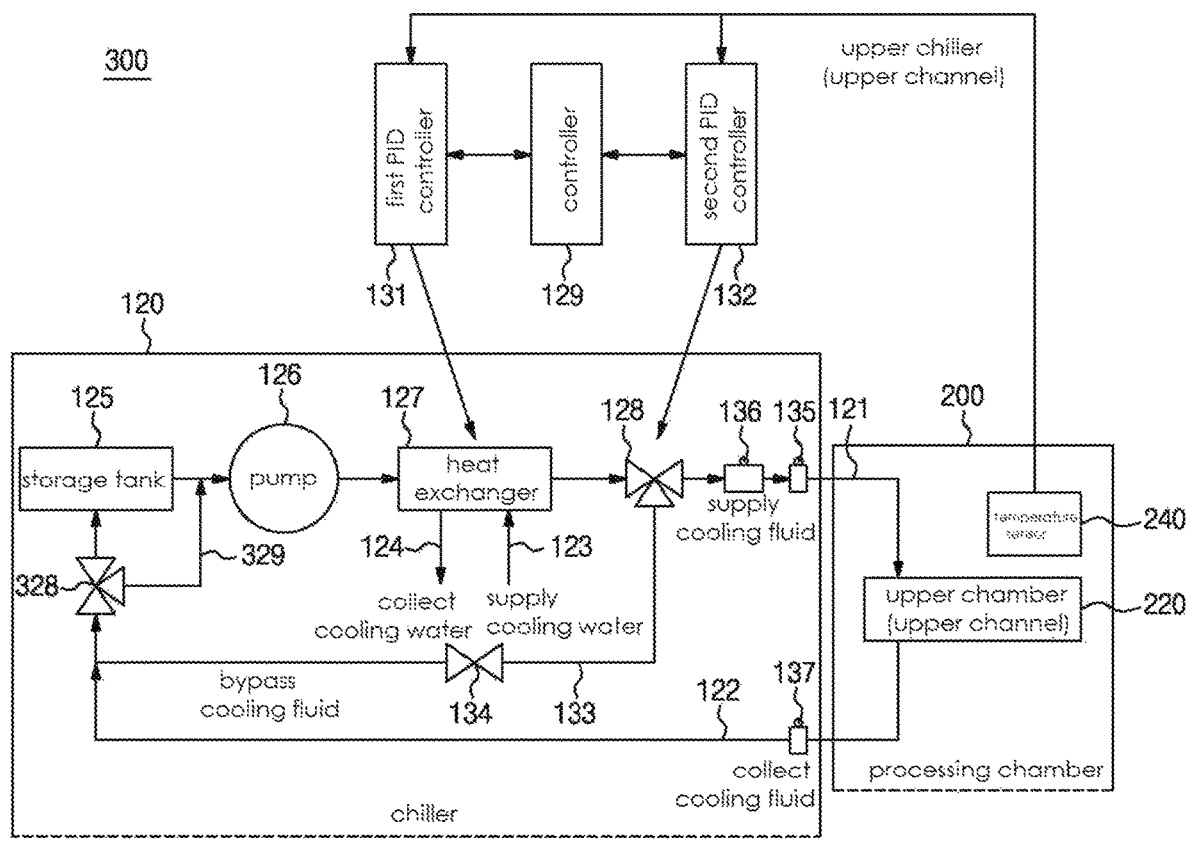
FIG. 5 is a block diagram illustrating an example configuration of a temperature controller connected with a processing chamber for semiconductor fabrication according to an embodiment.

FIG. 5 is a block diagram illustrating an example configuration of a temperature controller 300 connected with a processing chamber for semiconductor fabrication according to an embodiment.

Referring to FIG. 5, a temperature controller 300 according to an embodiment may include another three-way valve 328 connected between a node between the cooling fluid collecting pipe 122 and the bypass pipe 133 and the storage tank 125 and a connecting pipe 329 between the three-way valve 328 and a node between the storage tank 125 and the pump 126. The degree of bypass opening of the three-way valve 328 may be adjusted by the second PID controller 132, and as the degree of bypass opening increases, the flow rate of the cooling fluid directly delivered through the connecting pipe 329 to the pump 126 may increase. The second PID controller 132 may control the three-way valve 328 so that, during a semiconductor fabrication process, a portion of the cooling fluid may be introduced into the storage tank 125 and another portion of the cooling fluid may be introduced into the pump 126.

As an example, the second PID controller 132 may determine and control the degree of bypass opening of the three-way valve 328 based on the temperature measured or sensed by the upper chamber temperature sensor 240. For example, the second PID controller 132 may determine and control the degree of bypass opening of the three-way valve 328 based on the temperature measured or sensed by the upper chamber temperature sensor 240 and the flow rate measured or sensed by the supplying pipe flow sensor 136 which are obtained from the controller 129.

As an example, where the temperature measured or sensed by the upper chamber temperature sensor 240 is higher than a preset reference value, the second PID controller 132 may increase the degree of bypass opening of the three-way valve 328 to increase the flow rate of the cooling fluid conveyed through the connecting pipe 329 to the pump 126. In contrast, as an example, where the temperature measured or sensed by the upper chamber temperature sensor 240 is lower than the preset reference value, the second PID controller 132 may decrease the degree of bypass opening of the three-way valve 328 to decrease the flow rate of the cooling fluid conveyed through the connecting pipe 329 to the pump 126.

In other words, where the temperature measured or sensed by the upper chamber temperature sensor 240 is higher than the preset reference value, the second PID controller 132 may increase the degree of bypass opening of the three-way valve 328, reducing the flow rate of the cooling fluid collected to the storage tank 125. In contrast, where the temperature measured or sensed by the upper chamber temperature sensor 240 is lower than the preset reference value, the second PID controller 132 may reduce the degree of bypass opening of the three-way valve 328, increasing the flow rate of the cooling fluid collected to the storage tank 125.

Thus, a high-temperature cooling fluid may be prevented from being collected to the storage tank 125 by the control of the second PID controller 132. The cooling fluid flowing through the cooling fluid collecting pipe 122 and the bypass pipe 133 may be very hot. The storage tank 125 may be prevented from exposure to or influx of the hot cooling fluid and, thus, the cooling fluid in the storage tank 125 may remain nearly at room temperature or mild temperature and the cooling fluid in the storage tank 125 may be avoided from evaporation.

Where the temperature measured or sensed by the supplying pipe temperature sensor 135 is higher than the preset reference value, the second PID controller 132 may be operated in an opposite way of the above-described operation, thus controlling the three-way valve 328 to allow the cooling fluid sufficiently cooled down to be supplied to the upper chamber 220. The reference value for the upper part temperature sensor 135 may be set to be larger than the reference value for the upper chamber temperature sensor 240.

As an example, where the temperature measured or sensed by the supplying pipe temperature sensor 135 is higher than the preset reference value, the second PID controller 132 may decrease the degree of bypass opening of the three-way valve 328, reducing the flow rate of the cooling fluid conveyed through the connecting pipe 329 to the pump 126. In contrast, where the temperature measured or sensed by the supplying pipe temperature sensor 135 is lower than the preset reference value, the second PID controller 132 may increase the degree of bypass opening of the three-way valve 328, increasing the flow rate of the cooling fluid conveyed through the connecting pipe 329 to the pump 126. Thus, where the temperature measured or sensed by the supplying pipe temperature sensor 135 is higher than the temperature measured or sensed by the upper chamber temperature sensor 240, the upper chamber 220 may be regarded as being substantially in a non-cooled state to allow a relatively large amount of cool cooling fluid to be quickly supplied to the upper chamber 220, preventing thermal impacts to the upper chamber.

According to an embodiment, there may be provided a temperature controller for semiconductor fabrication, capable of reducing thermal impacts by a heater and/or radio frequency (RF) source in a processing chamber.

According to embodiments of the disclosure, in the temperature controller for semiconductor fabrication, the three-way valve may be installed on the cooling fluid supplying pipe, and the bypass pipe may be installed between the three-way valve and the cooling fluid collecting pipe to reduce the degree of bypass opening of the three-way valve to increase the flow rate of the cooling fluid supplied through the cooling fluid supplying pipe when the temperature of the upper chamber is higher than a preset reference value and to increase the degree of bypass opening of the three-way valve to decrease the flow rate of the cooling fluid supplied through the cooling fluid supplying pipe when the temperature of the upper chamber is lower than the preset reference value. Thus, where the temperature in the processing chamber is about to be drastically varied by the operation of the heater and/or RF generator installed in the processing chamber, the temperature controller may enable the three-way valve to immediately operate to vary the flow rate of the cooling fluid supplied to the processing chamber, thus preventing damage to the inside of the processing chamber due to thermal impacts.

While the disclosure has been shown and described with reference to exemplary embodiments thereof, it will be apparent to those of ordinary skill in the art that various changes in form and detail may be made thereto without departing from the spirit and scope of the disclosure as defined by the following claims.

What is claimed is:

1. A temperature controller for semiconductor fabrication, comprising:
   a lower chiller connected with a lower chamber of a processing chamber and configured to adjust a temperature of the lower chamber, an electrostatic chuck disposed in the lower chamber; and
   an upper chiller connected with an upper chamber of the processing chamber and configured to adjust a temperature of the upper chamber, a heater disposed in the upper chamber, wherein the upper chiller includes a storage tank configured to store a cooling fluid, a pump connected with the storage tank and configured to pump the cooling fluid, a heat exchanger connected with the pump and configured to exchange heat from the cooling fluid, a three-way valve connected with the heat exchanger and configured to supply a portion of the cooling fluid to the upper chamber through a supplying pipe and bypass another portion of the cooling fluid to the storage tank through a bypass pipe, an upper chamber temperature sensor configured to sense the temperature of the upper chamber, a first proportional integral derivative (PID) controller configured to determine an amount of heat exchanged in the heat exchanger based on the temperature sensed by the upper chamber temperature sensor, and a second PID controller configured to determine a degree of bypass opening of the three-way valve based on the temperature sensed by the upper chamber temperature sensor.

2. The temperature controller of claim 1, further comprising:
   a controller configured to control the first PID controller and the second PID controller;
   a supplying pipe temperature sensor and a supplying pipe flow sensor connected with the supplying pipe; and
   a collecting pipe temperature sensor connected with a collecting pipe connecting the storage tank and the upper chamber, wherein the controller is configured to control the first PID controller and the second PID controller based on a temperature of supply, a temperature of collection, and a flow rate of supply of the cooling fluid from the supplying pipe temperature sensor, the collecting pipe temperature sensor, and the supplying pipe flow sensor.

3. The temperature controller of claim 2, wherein the first PID controller is configured to control the amount of heat exchanged in the heat exchanger based on a temperature sensed by the supplying pipe temperature sensor, a temperature sensed by the collecting pipe temperature sensor, and the temperature sensed by the upper chamber temperature sensor and obtained from the controller.

4. The temperature controller of claim 2, wherein the first PID controller is configured to, when the temperature sensed by the upper chamber temperature sensor is higher than a preset reference value, increase the amount of heat exchanged in the heat exchanger to reduce the temperature of the cooling fluid supplied through the supplying pipe.

5. The temperature controller of claim 2, wherein the first PID controller is configured to, when the temperature sensed by the upper chamber temperature sensor is lower than a preset reference value, decrease the amount of heat exchanged in the heat exchanger to increase the temperature of the cooling fluid supplied through the supplying pipe.

6. The temperature controller of claim 2, wherein the second PID controller is configured to control the degree of bypass opening of the three-way valve based on the temperature sensed by the upper chamber temperature sensor and the flow rate sensed by the supplying pipe flow sensor and obtained from the controller.

7. The temperature controller of claim 2, wherein the second PID controller is configured to, when the temperature sensed by the upper chamber temperature sensor is higher than the preset reference value, decrease the degree of bypass opening of the three-way valve to increase the flow rate of the cooling fluid supplied through the supplying pipe.

8. The temperature controller of claim 2, wherein the second PID controller is configured to, when the temperature sensed by the upper chamber temperature sensor is lower than the preset reference value, increase the degree of bypass opening of the three-way valve to decrease the flow rate of the cooling fluid supplied through the supplying pipe.

9. The temperature controller of claim 1, wherein an automated pressure adjusting valve is installed on the bypass pipe and is configured to automatically adjust a pressure in the bypass pipe according to a variation in the degree of opening of the three-way valve.

* * * * *